United States Patent [19]

Mader et al.

[11] Patent Number: 5,357,209

[45] Date of Patent: Oct. 18, 1994

[54] LIMITING AMPLIFIER

[75] Inventors: Heinz B. Mader, Weinfelden, Switzerland; Johan U. Tingsborg, Solna; Carl-Gustaf Thisell, Stockholm, both of Sweden

[73] Assignee: Telefonaktiebolaget L M Ericsson, Stockholm, Sweden

[21] Appl. No.: 883,114

[22] Filed: May 14, 1992

[30] Foreign Application Priority Data

May 15, 1991 [SE] Sweden ............... 9101459-7

[51] Int. Cl.⁵ ............................................. H03F 3/45
[52] U.S. Cl. ..................................... 330/252; 330/261
[58] Field of Search ............... 330/252, 254, 261, 310; 307/540, 544, 564

[56] References Cited

U.S. PATENT DOCUMENTS

| | | | |
|---|---|---|---|
| 4,528,515 | 7/1985 | Gross | 330/254 |
| 4,605,906 | 8/1986 | Miller | 330/252 X |
| 4,914,401 | 4/1990 | Mader | 330/261 |
| 5,039,952 | 8/1991 | Dreps et al. | 330/261 |

OTHER PUBLICATIONS

M. Cooke et al., "Integrated Circuits for a 200-Mbit/s Fiber-Optic Link", *IEEE Journal of Solid-State Circuits*, vol. sc-21, pp. 909-915, (Dec. 1986).

R. Reimann et al., "Bipolar High-Gain Limiting Amplifier IC for Optical-Fiber Receivers Operating up to 4 Gbit/s", *IEEE Journal of Solid-State Circuits*, vol. sc-22, pp. 504-511, (Aug. 1987).

*Primary Examiner*—Steven Mottola
*Attorney, Agent, or Firm*—Burns, Doane, Swecker & Mathis

[57] ABSTRACT

A limiting amplifier has between an amplifier input and an amplifier output at least one amplifier stage as well as load components. The amplifier has an output signal limiting device for limiting the maximum amplitude of the output signal and the amplification and includes a current drain device connected to the amplifier stage output and drawing current through the load components. More particularly, the amplifier stage can be a differential amplifier stage with a differential input and a differential output, two current drain devices being connected to each one of the terminals of the differential output.

11 Claims, 2 Drawing Sheets

LIMITING AMPLIFIER

BACKGROUND

The present invention relates to a limiting amplifier, which comprises at least one amplifier stage between an amplifier input and an amplifier output, said amplifier stage including at least one amplifying component and load components, and which has an output signal limiting means limiting the maximum amplitude and the amplification of the output signal.

The invention is directed to such applications of the signal amplification art where it can occur that an incoming signal needing amplification has so great amplitude variations that the greatest amplitude values thereof fall outside the dynamic range of a conventional amplifier, i.e. the range within which the amplification is linear. As an example signal transmission via fiber-optic links can be mentioned, where the amplitude of the optical signals can vary considerably from link to link depending upon the distance between sender and transmitter. In order to be able to cope with this variation the receiver can include a symmetrical limiting amplifier.

The use of limiting amplifiers in connection with signal reception on fiber-optic links is described for example in two articles in the journal IEEE Journal of Solid-State Circuits, viz. in volume sc-21, No. 6, December, 1986, with the title "Integrated Circuits for a 200-Mbit/s Fiber-Optic Link", and in volume sc-22, No. 4, August 1987, with the title "Bipolar High-Gain Limiting Amplifier IC for Optical-Fiber Receivers Operating up to 4 Gbit/s."

Through U.S. Pat. No. 4,528,515 a high-frequency differential amplifier is known, in which an emitter-coupled pair of transistors each has its transistor input stage, of which the transconductance of the transistors can be varied by means of a variable current source. The aim is to vary the bandwidth and the damping factor of the differential amplifier without decreasing its amplification and dynamic range.

Through the Swedish laid-out specification 457 922 (corresponding to EP 88850158.2) a device for use in an active filter is known, which includes a differential amplifier stage with a differential input and a differential output.

The differential amplifier stage has two sets of components between a supply voltage and a current generator. The components of each set on the one hand include an amplifying component with a control electrode and a main conducting path between a first and a second current electrode, on the second hand a first group of series connected diode components arranged in a series circuit with the amplifying component between the first current electrode and the current generator, and on the third hand at least a second group of series connected diode components in series or in parallel with said series circuit. The control electrodes are connected in opposition to each terminal of the differential input so that difference between the potentials on the current electrodes increases with increasing voltage over the differential input. At the other current electrodes the amplifying components are connected in opposition to each terminal of the differential output so that the voltage over the differential output varies with the difference between the forward voltage drops over the two amplifying components.

The current generator is so arranged that it tends to keep the sum of the currents through the amplifying components constant.

SUMMARY

A general object of the invention is to provide a limiting amplifier of the kind indicated by way of introduction, which has a well defined amplification and a maximum output voltage, a reliable function, and is easily implemented.

Preferably, the limiting amplifier should be able to work with a supply voltage of only 5 volt, and be suitable for integration in bipolar circuit techniques.

A particular object of the invention is to provide a limiting amplifier having the properties just mentioned for operation in the VHF— and UHF—bands.

The general object has been attained in that, in the limiting amplifier according to the invention, the output signal limiting means includes a current drain means connected to the output of the amplifier stage and being arranged to draw current through the load components.

Advantageous embodiments of the limiting amplifier according to the invention are indicated in the subclaims.

In particular a limiting amplifier according to the invention is obtained, which is well suitable for operation in the VHF and UHF bands, if, according to a particularly preferred embodiment the amplifier stage is a differential amplifier stage with a differential input and a differential output, and two current drain means are connected, one to each of the terminals of the differential output.

DESCRIPTION OF THE DRAWINGS

Some embodiments of the invention shall now be described more closely below with reference to the attached drawings, in which.

DETAILED DESCRIPTION

Figure 1:
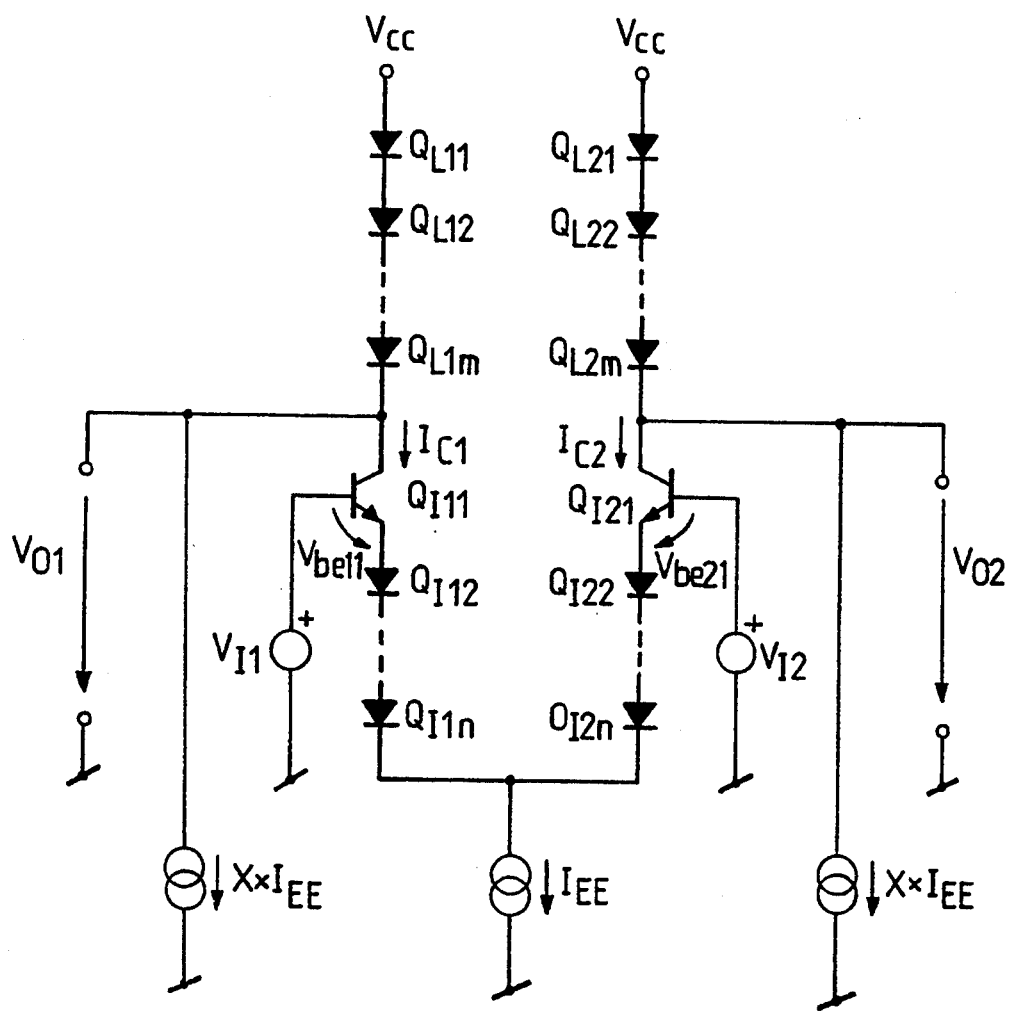
FIG. 1 illustrates fundamental schematic circuit diagram of one embodiment of a single limiting amplifier stage according to the invention, and FIG. 2 in the form of a circuit diagram illustrates how one embodiment of the limiting amplifier according to the invention can be implemented by several amplifier stages according to FIG. 1 in series.

FIG. 1 illustrates a differential amplifier stage with a differential input $V_{I1}$-$V_{I2}$ and a differential output $V_{O1}$-$V_{O2}$, and two sets of components between a supply voltage $V_{cc}$ and a current generator $I_{EE}$. In each set the components include a respective amplifying component $Q_{I11}$ and $Q_{I21}$ with a control electrode and a main conduction path between a first and a second current electrode, a number of inverting components arranged in a series circuit with the amplifying component between the first current electrode and the current generator, a number of load components in series with the series circuit. The inverting components consist of a respective first group of series connected diode components $Q_{I12}$-$Q_{I1n}$ and $Q_{I22}$-$Q_{I2n}$, and the load components consist of a respective second group of series connected diode components $Q_{L11}$-$Q_{L1m}$ and $Q_{L21}$-$Q_{L2m}$.

More particularly, the amplifying components in the illustrated embodiment consist of two similar NPN-transistors with a respective base electrode b11 and b21, a respective emitter electrode e11 and e21, and a respective collector electrode k11 and k21, these electrodes forming the control electrode, the first current electrode and the second current electrode, respectively. The main conduction path accordingly consists of the respective collector-emitter path k11-e11 and k21-e21. The diode components are NPN-transistors of the same kind as the amplifying components but with their base and collector electrodes connected together. Each diode component therefore has a forward voltage drop corresponding to the respective base emitter voltage $V_{be11}$ and $V_{be21}$, of an amplifying component.

The respective control electrodes b11 and b21, of the amplifying components are connected in opposition to each respective terminal $V_{I1}$ and $V_{I2}$ of the differential input so that the difference between the potentials on the control electrodes increases with increasing voltage over the differential input. The amplifying components with their respective second current electrodes k11 and k21 are connected in opposition to each respective terminal VN01 and $V_{O2}$ of the differential output so that the voltage over the differential output varies with the difference between the forward voltage drops over the two amplifying components.

The current generator $I_{EE}$ is connected so that it tends to keep the sum of the currents through the amplifying components constant.

The above described details of the differential amplifier stage of FIG. 1 essentially agree with the corresponding details of one of the embodiments of active filters in the above mentioned EP 88850158.2, to which reference is made for further details.

In the described embodiment are now, in accordance with the present invention, two similar current drain or current generator means $x*I_{EE}$ each connected to a respective one of the terminals of the differential output, where x designates a factor which can be a constant or a variable. The current drain means are arranged to draw current through the load components in a way to be described more closely below with reference to FIG. 2.

To start it should be observed that when $x=0$ the circuit of FIG. 1 consists only of the differential amplifier known through EP 88850158.2. Provided all components are forward biased a linear dc transfer characteristic is obtained. The amplification is determined by the relationship between the number of load components m and the number of inverting components n, the so called stacking ratio, i.e. the amplification $A = -m/n$.

It can be shown that when x in FIG. 1 increases, the amplification decreases, as does the maximum $V_{UT}=V_{01}-V_{02}$. This implies that the desired maximum differential output voltage can be easily chosen by dimensioning x.

More particularly it can be shown that $$V_{UT}(max) \approx m * Vt * \ln[((1+x) * IEE+Is)/(x * IEE+Is)]$$

where $V_{UT}(max)$ = the maximum differential output voltage,

Vt = thermo voltage equivalent = kT/q = 26 mV at 300 K

Is = saturating current.

Increasing the number of diode and amplifying components in each series circuit of the differential amplifier results in increase of the dynamic range of the amplifier to a corresponding degree. In the basic amplifier shown in FIG. 1 this number is limited to four, if the amplifier shall be able to operate with a supply voltage of only approximately 5 volts.

Figure 2:
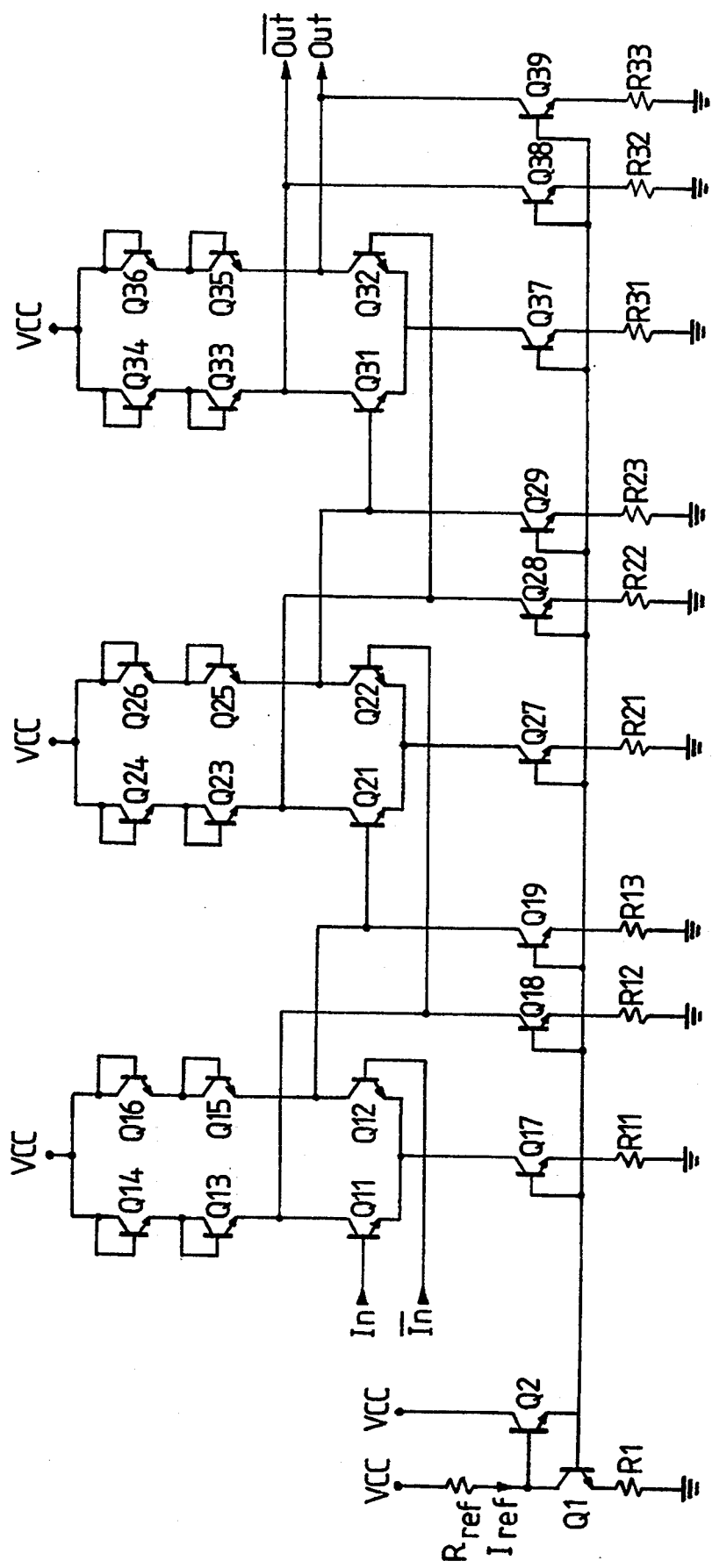

One way of widening the dynamic range is to connect several limiting amplifier stages in series. FIG. 2 shows an example of such a series circuit, including three limiting differential amplifier stages F1, F2 and F3, respectively, similar to the one in FIG. 1.

Each amplifier stage includes two amplification components consisting of respective similar NPN-transistors Q11 and Q12 of the stage F1, Q21 and Q22 of the stage F2, and Q31 and Q32 of the stage F3. In each amplifier stage the two amplifying components are included in each of two parallel sets of series connected components between a common supply voltage VCC and a common current generator, which in the respective amplifier stages is schematically illustrated with the collector emitter path of a transistor Q17, Q27 and Q37, respectively, in series with a resistor R11, R21 and R31, respectively.

The series connected components include in each set, besides the amplifying component, an inverting component and two load components which gives a stacking ratio of 2, in accordance with the definitions included in connection with the description above of the embodiment of FIG. 1. The inverting component consists of the base emitter diode of the corresponding amplifying component, whereas the load components consist of two diode components in series between the supply voltage VCC and the amplifying component. The last mentioned diode components consist of similar NPN transistors with the base and the collector electrodes connected together, viz. in the amplifier stage F1 the diode components Q13 and Q14, and Q15 and Q16, respectively, in the amplifier stage F2 the diode components Q23 and Q24, and Q25 and Q26, respectively, and in the amplifier stage F3 the diode components Q33 and Q34, and Q35 and Q36, respectively.

The control electrodes of the amplifying components Q11 and Q12 are connected in opposition to each respective terminal In and In of the differential input of the amplifier. The differential output of the amplifier stage F1 is connected to the differential input of the amplifier stage F2, the differential output of which is connected to the differential input of the amplifier stage F3. More particularly the respective collector electrodes of the amplifying components Q11 and Q12 are connected in opposition to the control electrodes of the respective amplifying components Q22 and Q21, the collector electrodes of which in turn being connected in opposition to the control electrodes of the respective amplifying components Q32 and Q31. The control electrodes of the amplifying components Q31 and Q32 are connected in opposition to each respective terminal Ut and Ut of the differential output of the amplifier.

The respective collector electrode of each amplifying component Q11, Q12, Q21, Q22, Q31, Q32 is connected to ground via a current drain means consisting of a series circuit of a respective transistor Q18, Q19, Q28, Q29, Q38, and Q 39, and a respective resistor R12, R13, R22, R23, R32, and R33.

For synchronous control of the currents through the respective current generators of the amplifier stages F1, F2, F3 the control electrodes of the respective transistors Q17–Q19, Q27–Q29, Q37–Q39 of the latter, in a conventional way are commonly connected in current mirror circuit with a circuit Q1, Q2, R1, the input of which being supplied with a reference current Iref. The value of reference current Iref can be constant by e.g.

deriving it, as indicated in FIG. 2, from the supply voltage VCC via a resistor Rref, but it can also be controlled by means of some suitable circuit parameter for thereby making it possible to control the currents through the current generators in dependence from this circuit parameter.

The total amplification and maximum output voltage of the limiting amplifier described above with reference to FIG. 2, can be determined only by dimensioning the above mentioned factor x for the respective amplifier stages. The limitation of the incoming signal can be carried through more smoothly if the amplifier stages are connected after increasing x-values. Thereby the limitation of the incoming signal is carried through gradually. As an example the x-value of the stages F1, F2, F3 can be chosen to amount to 0,1, 0,2 and 1, respectively, which, at a value 1 kohm of the resistors R11, R21 and R32, gives a value 10 kohm to the resistors R12, R13, 5 kohm to the resistors R22,R23, and 1 kohm to the resistors R32,R33. The latter values are approximate so far as they do not consider variations in the base-emitter voltage drop of the components Q17–Q19, Q27–Q29, Q37–Q39, caused by current variations.

The invention is, of course, not limited to the embodiments described above with reference to the drawings, but can be varied within the scope of the following patent claims. Thus, it is also conceivable to use the invention at amplifiers of another type than differential amplifiers.

We claim:

1. A limiting amplifier having an amplifier input and an amplifier output, and comprising:
    at least one amplifier stage between said amplifier input and said amplifier output, said amplifier stage including at least one amplifying component and load components,
    an output signal limiting means limiting the maximum amplitude of an output signal and the amplification of said amplifier,
    said output signal limiting means including a current drain means connected to an output of said amplifier stage and being arranged to draw current through said load components, wherein the current drain means draws a current the amount of which is selectively adjusted to obtain a predetermined maximum output voltage, wherein said amplifier stage is a differential amplifier stage having a differential input and a differential output, said differential output having two terminals, and wherein the output signal limiting means includes first and second current drain means, the first current drain means is connected to one of said terminals, and the second current drain means is connected to the other one of said terminals.

2. An amplifier according to claim 1, wherein said first and second current drain means are arranged to derive equal currents.

3. An amplifier according to claim 2, wherein said differential amplifier stage is of a type, known per se, having two sets of components between a supply voltage and a current generator, said components of each set including
    an amplifying component with a control electrode and a main conducting path between a first and a second current electrode,
    a first group of series connected diode components connected in series circuit with said amplifying component between said first current electrode and said current generator, and
    at least one second group of series connected diode components disposed in one of a series configuration and a parallel configuration with said series circuit,
    said control electrodes being connected in opposition to a respective terminal of said differential input so that the difference between the potentials on said control electrodes increases with increasing voltage over said differential input,
    said amplifying components at said second current electrodes being connected in opposition to a respective terminal of said differential output so that the voltage of said differential output varies with the difference between the forward voltage drops over the two amplifying components,
    said current generator being arranged so as to tend to keep the sum of the currents through said amplifying components constant.

4. A limiting amplifier having an amplifier input and an amplifier output, and comprising:
    several series connected amplifier stages with current drain means between said amplifier input and said amplifier output,
    each amplifier stage including an amplifying component and load components,
    an output signal limiting means limiting the maximum amplitude of an output signal and the amplification of said amplifier,
    said output signal limiting means including a current drain means connected to an output of said amplifier stage and being arranged to draw current through said load components, wherein the current drain means draws a current the amount of which is selectively adjusted to obtain a predetermined maximum output voltage.

5. An amplifier according to claim 3, including several series connected amplifier stages, each amplifier stage including respective first and second current drain means.

6. An amplifier according to claim 4, said current drain means of the respective series connected amplifier stages being respectively dimensioned so as to successively increase the current drain through the load components for each amplifier stage following the first amplifier stage.

7. An amplifier according to claim 1, including several series connected amplifier stages, each amplifier stage including respective first and second current drain means.

8. An amplifier according to claim 7, said first and second current drain means of the respective series connected amplifier stages being respectively dimensioned so as to successively increase the current drain through the load components for each amplifier stage following the first amplifier stage.

9. An amplifier according to claim 3, including several series connected amplifier stages, each amplifier stage including respective first and second current drain means.

10. An amplifier according to claim 9, said first and second current drain means of the respective series connected amplifier stages being respectively dimensioned so as to successively increase the current drain through the load components for each amplifier stage following the first amplifier stage.

11. An amplifier according to claim 5, said first and second current drain means of the respective series connected amplifier stages being respectively dimensioned so as to successively increase the current drain through the load components for each amplifier stage following the first amplifier stage.

* * * * *